(12) United States Patent
King et al.

(10) Patent No.: US 8,736,280 B2
(45) Date of Patent: May 27, 2014

(54) HIGH SPEED DATA BUS TESTER

(75) Inventors: Harold R. King, Kansas City, MO (US); Sang Burton, Independence, MO (US)

(73) Assignee: DIT-MCO International Corporation, Kansas City, MO (US)

( * ) Notice: Subject to any disclaimer, the term of this patent is extended or adjusted under 35 U.S.C. 154(b) by 426 days.

(21) Appl. No.: 13/222,836

(22) Filed: Aug. 31, 2011

(65) Prior Publication Data

US 2013/0049767 A1 Feb. 28, 2013

(51) Int. Cl.
*G01R 27/02* (2006.01)

(52) U.S. Cl.
USPC ......................................... 324/605

(58) Field of Classification Search
USPC .................. 324/522–524, 527, 605
See application file for complete search history.

(56) References Cited

U.S. PATENT DOCUMENTS

| 4,213,085 A | * | 7/1980 | Ramer | 324/622 |
| 5,821,640 A | * | 10/1998 | Rouchaud | 307/115 |
| 2009/0066422 A1 | * | 3/2009 | Bartlett | 330/296 |

OTHER PUBLICATIONS

Portable MIL-STD-1553 databus network tester; precise, rapid & handy, press release issued by Axon Cable SAS on Dec. 4, 2006.*
Alta dt; Data Technolgies; MIL-STD-1553 Tutorial and Reference; Sep. 6, 2007; www.altadt.com.
MIL-STD-1553 Today and Into the Future; Presented by the IEEE Long Island Section, Instrumentation & Measurement Society on Nov. 13, 2008; DDC Data Device Corporation.

* cited by examiner

*Primary Examiner* — Melissa Koval
*Assistant Examiner* — Daniel Miller
(74) *Attorney, Agent, or Firm* — Hovey Williams LLP

(57) ABSTRACT

A circuit for testing a high speed data bus comprises a test port, a data bus port, a signal generator, a polarity monitor, and an attenuation monitor. The test port is coupled to a test controller. The data bus port is coupled to the data bus. The signal generator may generate a test signal to the data bus port at a first voltage level with a duty cycle of fifty percent or greater. The polarity monitor may receive the test signal from the data bus port and generate a voltage that is proportional to the duty cycle and indicative of a polarity of a portion of the data bus. The attenuation monitor may receive the test signal from either the signal generator or the data bus port and determine a second voltage level of the received test signal, with the second voltage level being communicated to the test port.

16 Claims, 3 Drawing Sheets

HIGH SPEED DATA BUS TESTER

BACKGROUND OF THE INVENTION

1. Field of the Invention

Embodiments of the present invention relate to electronic testing circuitry. More particularly, embodiments of the present invention relate to electronic circuitry to test a high speed data bus.

2. Description of the Related Art

Aircraft and other vehicles often include data communication systems that transmit electronic data over a data bus. For example, components in one location of the aircraft, such as cockpit control systems, may communicate with components in another location, such as engine or rudder controllers. Ground-based vehicles, such as military tanks, and marine vessels, such as submarines, may include similar types of data communication systems. The data bus used in these types of systems is typically implemented utilizing the MIL-STD-1553 standard for data buses. The MIL-STD-1553 standard is published by the United States Department of Defense and specifies the requirements for the architecture of the data bus as well as the physical connection between components. Other buses, such as the controller-area network (CAN) bus for the automotive industry, may include similar features.

The MIL-STD-1553 data bus is a serial communication bus that operates at 1 megahertz (MHz) and includes a main trunk to which each component is connected. The MIL-STD-1553 data bus requires a bus controller, which is connected to the main trunk, to manage communication between the components. A component generally checks with the bus controller before communicating with another component over the data bus. The main trunk may be a two-line bus which is physically implemented with a two-wire cable, such as a coaxial cable or a twisted pair cable. Each end of the main trunk is terminated with an impedance, known as a terminator, between the two lines. Each component and the bus controller are connected to the main trunk through a stub coupler. The stub coupler is configured to include a transformer whose primary is coupled to one of the lines of the data bus and whose secondary couples to the component or the bus controller, usually through another two-wire cable. Thus, the MIL-STD-1553 data bus typically includes at least the following: a first terminator connected to a first stub coupler, which is connected to a component or a bus controller through a first cable. Also connected to the first stub coupler is a second cable that connects to a second stub coupler, to which is connected the component or the bus controller through a third cable. If that is the end of the main trunk, then a second terminator may also be connected to the second stub coupler.

The MIL-STD-1553 data bus, to which a large number of components may be connected, may experience a certain amount of signal attenuation because the data communicated from one component to another may travel through a large number of cables and stub couplers. Furthermore, it is possible for the cables or stub couplers to become misconnected such that the two lines of a portion of the data bus have the wrong polarity. These same issues may affect other similar data buses.

SUMMARY OF THE INVENTION

Embodiments of the present invention solve the above-mentioned problems and provide a distinct advance in the art of electronic testing circuitry. More particularly, embodiments of the invention provide circuits and systems to test a high speed data bus.

Various embodiments of the present invention include a circuit for testing a high speed data bus, which comprises a test port, a data bus port, a signal generator, a polarity monitor, and an attenuation monitor. The test port may be coupled to a test controller. The data bus port may be coupled to the data bus. The signal generator may generate a test signal to the data bus port at a first voltage level with a duty cycle greater than fifty percent. The polarity monitor may receive the test signal from the data bus port and generate a polarity voltage that is proportional to the duty cycle and indicative of a polarity of a portion of the data bus. The attenuation monitor may receive the test signal from either the signal generator or the data bus port and determine a second voltage level of the received test signal, with the second voltage level being communicated to the test port.

The circuit may operate in one of four modes. In a first mode, the signal generator communicates the test signal to the data bus port and to the attenuation monitor which communicates the second voltage level to the test port. In a second mode, the attenuation monitor receives the test signal from the data bus port and communicates the second voltage level to the test port. In a third mode, the polarity monitor receives the test signal from the data bus port and communicates the polarity voltage to the test port. In a fourth mode, the test port is coupled to the data bus port.

Other embodiments of the present invention include a system for testing a high speed data bus, which comprises a first tester circuit and a second tester circuit. The first tester circuit and the second tester circuit may be implementations of the circuit discussed above. The first tester circuit may be coupled to the data bus at a first location and may include a signal generator configured to generate a test signal to the data bus at a first voltage level with a duty cycle greater than fifty percent and communicate the first voltage level to a test controller. The second tester circuit may be coupled to the data bus at a second location and may include an attenuation monitor configured to receive the test signal, determine a second voltage level of the received test signal, and communicate the second voltage level to the test controller, or a polarity monitor configured to receive the test signal, measure a voltage proportional to the duty cycle to determine a polarity of a wiring in the data bus, and communicate the polarity to the test controller.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
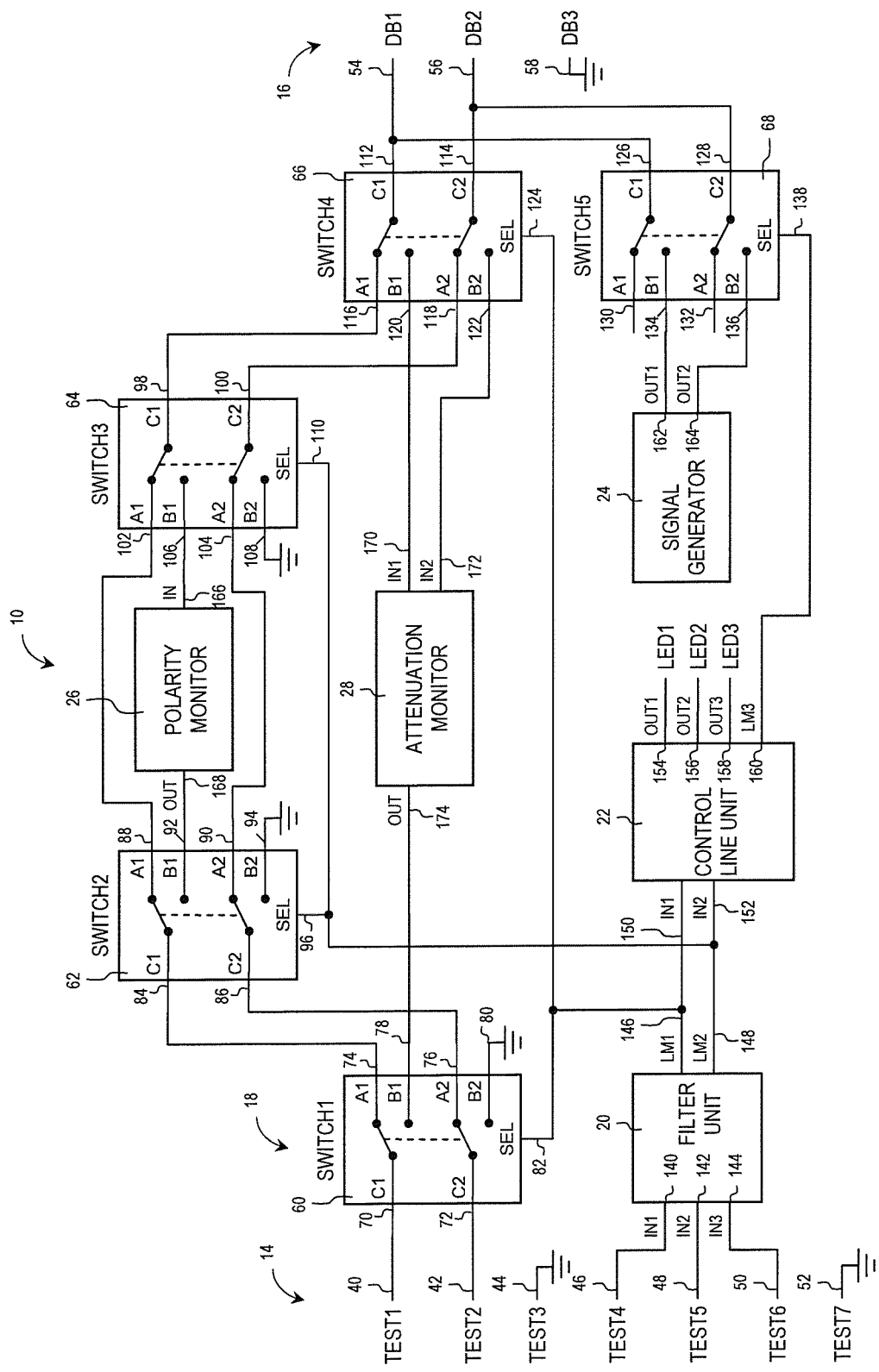
FIG. 1 is a schematic block diagram of a circuit, constructed in accordance with various embodiments of the present invention, for testing a high speed data bus.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Figure 2:
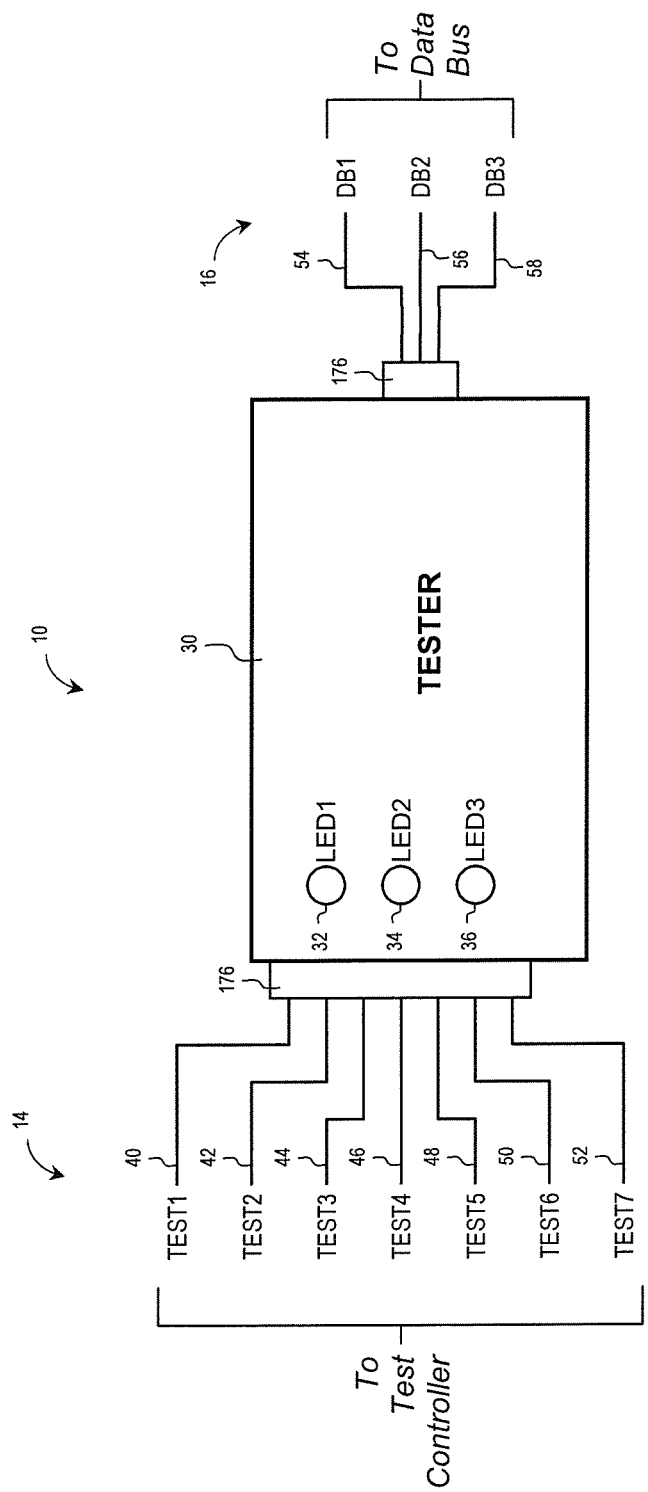
FIG. 2 is a top view of a housing for the circuit.

A circuit 10, shown in FIG. 1 and constructed in accordance with various embodiments of the present invention, for testing a high speed data bus 12 broadly comprises a test port 14, a data bus port 16, a plurality of switches 18, a filter unit 20, a control line unit 22, a signal generator 24, a polarity monitor 26, and an attenuation monitor 28. The circuit 10 may be packaged in a housing 30 that includes status indicators of a first light-emitting diode (LED) 32, a second LED 34, and a third LED 36, as shown in FIG. 2.

Figure 3:
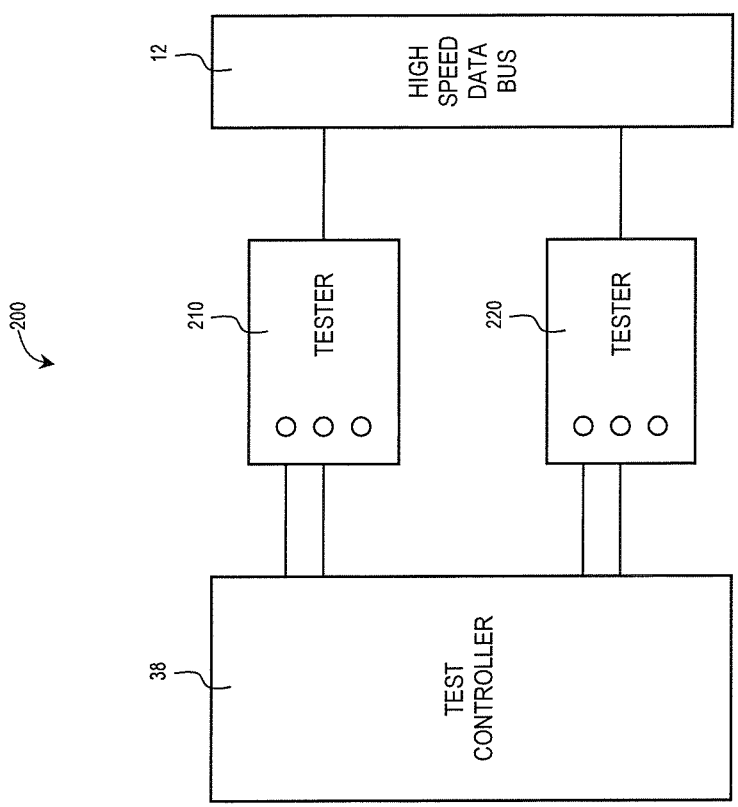
FIG. 3 is a schematic block diagram of a system for testing a high speed data bus.

The circuit 10 generally works with a test controller 38, shown in FIG. 3, when testing the high speed data bus 12. An example of the high speed data bus 12 is the MIL-STD-1553 data bus. Other data buses, such as the CAN bus, may also be tested using the circuit 10. The test controller 38 may oversee or manage the testing procedure for the high speed data bus 12 and may include electronic testing equipment, digital test equipment, digital signal processing (DSP) equipment, computers, combinations thereof, or other programmable electronic equipment. The test controller 38 may send control signals to the circuit 10 to control the operation of the circuit 10, may receive test signals or test data from the circuit 10 during testing, and may supply power to the circuit 10. In various embodiments, the circuit 10 may receive 28 volts (V) from the test controller 38.

The test port 14 may function as an interface between the test controller 38 and the circuit 10 and may include a first test signal 40, a second test signal 42, a third test signal 44, a fourth test signal 46, a fifth test signal 48, a sixth test signal 50, and a seventh test signal 52. In some embodiments, some of the test signals may be unnecessary and may be omitted, while in other embodiments, additional test signals may be included. The first test signal 40 and the second test signal 42 may send test data or signals from the circuit 10 to the test controller 38 or receive test data from the test controller 38 to be forwarded to the high speed data bus 12. The third test signal 44 and the seventh test signal 52 may be connected to ground or a common reference point. The fourth test signal 46 and the sixth test signal 50 may be control signals that control the operation of the circuit 10, as described in more detail below. The fifth test signal 48 may be connected to a common reference point.

The data bus port 16 may function as an interface between the high speed data bus 12 and the circuit 10 and may include a first data bus signal 54, a second data bus signal 56, and a third data bus signal 58. In some embodiments, some of the data bus signals may be unnecessary and may be omitted, while in other embodiments, additional data bus signals may be included. The first data bus signal 54 and the second data bus signal 56 may transmit test data from the circuit 10 to the high speed data bus 12 or may receive test data from the high speed data bus 12. The third data bus signal 58 may couple to a shield of the cable for the high speed data bus 12 and may be connected to ground or a common reference point in the circuit 10.

The switches 18 are generally of a double-pole, double-throw (DPDT) type and may include electronic or mechanical switching elements. An exemplary switch 18 may be a 20-2121 DPDT relay. Each switch 18 may include two common lines C1, C2, two first ports A1, A2, two second ports B1, B2, and a select line SEL. SEL may be of a binary nature and have two states—asserted and unasserted. When SEL is unasserted, the switch 18 may be in a default state with C1 connected to A1 and C2 connected to A2. When SEL is asserted, the switch 18 may be in a switched state with C1 connected to B1 and C2 connected to B2.

The circuit 10 may include a first switch 60, a second switch 62, a third switch 64, a fourth switch 66, and a fifth switch 68. The first switch 60 may include C1 70, C2 72, A1 74, A2 76, B1 78, B2 80, and SEL 82. The second switch 62 may include C1 84, C2 86, A1 88, A2 90, B1 92, B2 94, and SEL 96. The third switch 64 may include C1 98, C2 100, A1 102, A2 104, B1 106, B2 108, and SEL 110. The fourth switch 66 may include C1 112, C2 114, A1 116, A2 118, B1 120, B2 122, and SEL 124. The fifth switch 68 may include C1 126, C2 128 A1 130, A2 132, B1 134, B2 136, and SEL 138. The first switch 60 and the second switch 62 may form a first switching network. The third switch 64, the fourth switch 66, and the fifth switch 68 may form a second switching network.

The connections between the switches 18 are described here. The connections of the switches 18 with other components are described below. C1 70 and C2 72 of the first switch 60 are connected to the first test signal 40 and the second test signal 42, respectively. A1 74 and A2 76 of the first switch 60 are connected to C1 84 and C2 86, respectively, of the second switch 62. A1 88 and A2 90 of the second switch 62 are connected to A1 102 and A2 104, respectively, of the third switch 64. C1 98 and C2 100 of the third switch 64 are connected to A1 116 and A2 118, respectively, of the fourth switch 66. C1 112 and C2 114 of the fourth switch 66 are connected to the first data bus signal 54 and the second data bus signal 56, respectively. C1 112 and C2 114 of the fourth switch 66 are also connected to C1 126 and C2 128, respectively, of the fifth switch 68. A1 130 and A2 132 of the fifth switch 68 are not connected to anything.

The filter unit 20 generally filters noise from some of the test signals and may include a first input 140, a second input 142, a third input 144, and two outputs—LM1 146 and LM2 148. The first input 140 may be connected to the fourth test signal 46. The second input 142 may be connected to the fifth test signal 48. The third input 144 may be connected to the sixth test signal 50. The filter unit 20 may include inductive elements or transformers as well as discrete components to perform filtering functions. The first input 140 may be filtered to become the output LM1 146. Thus, LM1 146 may be functionally the same as the first input 140, and in turn, the fourth test signal 46, which is a control line. The second input 142 may be connected internally to ground or a common node. The third input 144 may be filtered to become the output LM2 148. Thus, LM2 148 may be functionally the same as the third input 144, and in turn, the sixth test signal 50, which is a control line. LM1 146 may be connected to SEL 82 of the first switch 60 and SEL 124 of the fourth switch 66. LM2 148 may be connected to SEL 96 of the second switch 62 and SEL 110 of the third switch 64.

The control line unit 22 may generate signals that are able to drive LEDs. The control line unit 22 may also generate an additional control signal, and may include a first input 150, a second input 152, a first output 154, a second output 156, a third output 158, and a control signal—LM3 160. The first input 150 may be connected to LM1 146, and the second input 152 may be connected to LM2 148. LM3 160 may be derived from the two control signals LM1 146 and LM2 148 as the logical AND of LM1 146 and LM2 148. Thus, LM3 may be a binary signal which may be asserted when LM1 146 and LM2 148 are asserted. Otherwise, if either LM1 146 or LM2 148 is not asserted, then LM3 160 is not asserted. LM3 160 may be connected to SEL 138 of the fifth switch 68.

The control line unit 22 may further include circuitry, such as transistors and discrete components including resistors, to generate signals to turn LEDs on and off. The first output 154 may be connected to the first LED 32, the second output 156 may be connected to the second LED 34, and the third output 158 may be connected to the third LED 36. The first output 154, the second output 156, and the third output 158 may be binary outputs that indicate the status of the control lines LM1 146, LM2 148, and LM3 160, respectively. Accordingly, the first LED 32, the second LED 34, and the third LED 36 also indicate the status of the control lines LM1 146, LM2 148, and LM3 160, respectively. Thus, the LEDs may be on when the control lines are asserted and may be off when the control lines are not asserted.

The signal generator 24 may generate a test signal to be transmitted to the high speed data bus 12, and may include a first output 162 and a second output 164. In some embodiments, the test signal may be any type of periodic waveform, such as a sine wave, a square wave, a trapezoidal wave, a triangle wave, a sawtooth wave, or the like. In other embodiments, the test signal may be compatible with the MIL-STD-1553 data bus standard and may be a square wave signal, with a high voltage and a low voltage, generated at approximately 1 MHz and 7 V peak or alternatively, 14 V peak-to-peak. In other embodiments, the test signal may conform to other standards. The duty cycle, or the percentage of the period when the signal is at the high voltage, of the test signal may be greater than 50%. In various embodiments, the duty cycle may be greater than 70%. Generating the test signal with a duty cycle of greater than 70% may be used to determine the polarity of the cables that are used to construct the high speed data bus 12, as explained in more detail below.

The signal generator 24 may be formed from oscillating components capable of generating a periodic waveform test signal, such as crystal oscillators, multivibrator circuits, timer circuits, charging circuits, filter circuits, and the like, and combinations thereof. The signal generator 24 may also include a transformer to which the first output 162 and the second output 164 are coupled in order to isolate the signal generator 24 output. The first output 162 may be connected to B1 134 of the fifth switch 68, and the second output 164 may be coupled to B2 136 of the fifth switch 68.

The polarity monitor 26 generally determines the polarity of the components that form the high speed data bus 12. As discussed in the "Description of the Related Art" section, the MIL-STD-1553 data bus may include a plurality of cables, each cable with at least two wires and a connector coupled to both ends of the cable, and a plurality of stub couplers, each one including a transformer. It is possible that the wires of one or more cables may not be properly coupled to the connectors at each end of the cable. It is also possible that one or more stub couplers may include a transformer that is not properly connected. In either case, the polarity of the high speed data bus 12, or at least a portion of the high speed data bus 12, may be incorrect.

The polarity monitor 26 may convert the test signal from the signal generator 24 to a direct current (DC) voltage that is proportional to the duty cycle of the test signal. Generally, the greater the duty cycle, the greater the DC voltage, and the lesser the duty cycle, the lesser the DC voltage. When the high speed data bus 12 is properly connected with the correct polarity, the duty cycle of the test signal may be greater than 70% and the corresponding DC voltage, as determined by the polarity monitor 26, may be at a first value. When the high speed data bus 12 is not properly connected and the polarity is incorrect, the duty cycle of the test signal may be inverted or roughly equal to 100% minus the duty cycle. If the original duty cycle is greater 70%, then the inverted duty cycle is roughly less than 30% (100%−70%). Thus, the corresponding DC voltage for a high speed data bus 12 with incorrect polarity may be at a second value, which is less than the first value of DC voltage for the correct polarity.

The polarity monitor 26 may be formed from single-sided rectifier circuits, half-wave rectifier circuits, full-wave rectifier circuits, operational amplifiers (opamps), transistors, diodes, discrete components, and the like, and combinations thereof. The polarity monitor 26 may include an input 166 and an output 168. The input 166 may be connected to B1 106 of the third switch 64. The output 168 may be connected to B1 92 of the second switch 62.

The attenuation monitor 28 generally detects the voltage level of the test signal and may be formed from level detection circuits, sensing circuits, opamps, transistors, diodes, discrete components, and the like, and combinations thereof. The attenuation monitor 28 may output a signal, such as a voltage or a current that corresponds to the voltage level of the test signal. The attenuation monitor 28 may include a first input 170, a second input 172, and an output 174. The first input 170 may be connected to B1 120 of the fourth switch 66, and the second input 172 may be connected to B2 122. The output 174 may be connected to B1 78 of the first switch 60.

The circuit 10 may be implemented on a printed circuit board (PCB) that is stored in the housing 30 shown in FIG. 2. The housing 30 may be manufactured from plastic and may include strain-relief couplers 176 for the wires of the test port 14 and the data bus port 16 that connect internally to the PCB.

The circuit 10 may operate in one of four modes as determined by the test controller 38. The fourth test signal 46 and the sixth test signal 50 are control signals that are communicated from the test controller 38. After filtering and derivation, the fourth test signal 46 and the sixth test signal 50 become control lines LM1 146, LM2 148, and LM3 160, which control the settings of the switches 18.

In a first mode, the circuit 10 acts as a test signal transmitter. LM1 146 and LM2 148 are both asserted from the test controller 38. Thus, LM3 160 is asserted as well. As a result, the fifth switch 68 is in the switched state with C1 126 and C2 128 connected to B1 134 and B2 136, respectively, thereby connecting the signal generator 24 to the first data bus signal 54 and the second data bus signal 56. The test signal may then be transmitted to the high speed data bus 12. In addition, since LM1 146 is asserted, the fourth switch 66 is in the switched state with C1 112 and C2 114 connected to B1 120 and B2 122, respectively, which allows the test signal from the signal generator 24 to be received by the attenuation monitor 28. Furthermore, since LM1 146 is asserted, the first switch 60 is in the switched state with C1 70 and C2 72 connected to B1 120 and B2 122, respectively, which allows the output signal of the attenuation monitor 28 to be received by the first test signal 40 and the second test signal 42, and in turn, the test controller 38. Therefore, in the first mode, the circuit 10 not only transmits the test signal to the high speed data bus 12, but the circuit 10 also communicates the voltage level of the transmitted test signal to the test controller 38 so that the test controller 38 can compare the voltage level of the transmitted signal to the voltage level of one or more received signals from other circuits 10.

In a second mode, the circuit 10 acts as a voltage level detector. LM1 146 is asserted, LM2 148 is not asserted, and LM3 160 is not asserted. As a result, the fourth switch 66 is in the switched state with C1 112 and C2 114 connected to B1 120 and B2 122, respectively, which allows the attenuation monitor 28 to receive the test signal from the high speed data bus 12 through the first data bus signal 54 and the second data bus signal 56. The attenuation monitor 28 does not receive a signal from the signal generator 24 because LM3 is not asserted so that C1 126 and C2 128 of the fifth switch 68 are connected to A1 130 and A2 132, respectively, which are both open circuited. Furthermore, since LM1 146 is asserted, the first switch 60 is in the switched state with C1 70 and C2 72 connected to B1 120 and B2 122, respectively, which allows the output signal of the attenuation monitor 28 to be received by the first test signal 40 and the second test signal 42, and in turn, the test controller 38. Therefore, in the second mode, the circuit 10 receives the test signal from the high speed data bus 12 and communicates the voltage level of the test signal to the test controller 38.

In a third mode, the circuit 10 acts as a polarity detector. LM1 146 is not asserted, LM2 148 is asserted, and LM3 160 is not asserted. As a result, the first switch 60 and the fourth switch 66 are in the default state with C1 and C2 connected to A1 and A2, respectively, for both switches. Since LM2 148 is asserted, the second switch 62 and the third switch 64 are both in the switched state with C1 and C2 connected to B1 and B2, respectively, for both switches. The polarity monitor 26 input 166 is connected to the high speed data bus 12 through the first data bus signal 54, the second data bus signal 56, the fourth switch 66, and the third switch 64. The output 168 of the polarity monitor 26 is connected to the test controller 38 through the second switch 62, the first switch 60, the first test signal 40, and the second test signal 42. Therefore, in the third mode, the circuit 10 receives the test signal from the high speed data bus 12 and communicates a voltage corresponding to the polarity of a portion of the high speed data bus 12 to the test controller 38.

In a fourth mode, the circuit 10 acts as a pass through. LM1 146 is not asserted, LM2 148 is not asserted, and LM3 160 is not asserted. As a result, all of the switches 18 are in the default state. Thus, the first test signal 40 and the second test signal 42 are connected to the first data bus signal 54 and the second data bus signal 56, respectively, through the first switch 60, the second switch 62, the third switch 64, and the fourth switch 66. In addition, since LM3 160 is not asserted, the signal generator 24 is not connected to the data bus port 16 through the fifth switch 68. Therefore, in the fourth mode, the test controller 38 is able to communicate directly with the high speed data bus 12 through the circuit 10 or alternatively, with such other electric circuitry as may be desired to be connected to the test controller 38.

A system 200 for testing a high speed data bus 12 is shown in FIG. 3 and may broadly comprise a first tester circuit 210 and a second tester circuit 220. In various embodiments, the system 200 comprises more tester circuits than just two. The first tester circuit 210 and the second tester circuit 220 are substantially identical to one another and are implementations of the circuit 10, which are operating in different modes. Typically, the first tester circuit 210 is connected to the high speed data bus 12 in a first location, perhaps near one end of the cabling. The second tester circuit 220 may be connected to the high speed data bus 12 at a second location, perhaps where it is desired to check the attenuation of the high speed data bus 12 or to check the polarity of the cables, connectors, and/or stub couplers. Additional circuits 10 may be connected to the high speed data bus 12 at other locations to test other portions of the high speed data bus 12 all at the same time. All of the circuits 10 are connected to the test controller 38 as shown in FIG. 3, and it is assumed that the test controller 38 may be programmed to manage the operation of the circuits 10.

The first tester circuit 210 may be configured to operate in the first mode, wherein the first tester circuit 210 transmits a test signal. Thus, the fourth test signal 46 and the sixth test signal 50 of the test port 14 may both be asserted. The first tester circuit 210 may then operate as described above, with the test signal being transmitted to the high speed data bus 12 and the voltage level of the transmitted signal being communicated to the test controller 38.

When the system 200 is utilized to measure the attenuation of the high speed data bus 12, the second tester circuit 220 may be configured to operate in the second mode, wherein the second tester circuit 220 detects a voltage level. Thus, the fourth test signal 46 may be asserted and the sixth test signal 50 of the test port 14 may be unasserted. The second tester circuit 220 may then operate as described above, with the test signal being received from the high speed data bus 12. The second tester circuit 220 may communicate the voltage level of the received test signal to the test controller 38, which may compare the received signal with the transmitted signal and determine the attenuation of the high speed data bus 12 between the first tester circuit 210 and the second tester circuit 220.

When the system 200 is utilized to determine the polarity of the high speed data bus 12, the second tester circuit 220 may be configured to operate in the third mode, wherein the second tester circuit 220 detects a polarity. The fourth test signal 46 may be unasserted and the sixth test signal 50 of the test port 14 may be asserted. The second tester circuit 220 may then operate as described above, with the test signal being received from the high speed data bus 12. The polarity monitor 26 may convert the test signal into a DC voltage proportional to the duty cycle of the test signal. The test controller 38 may receive the DC voltage from the second tester circuit 220 and may determine whether the polarity of the high speed data bus 12 is correct for the portion between the first tester circuit 210 and the second tester circuit 220.

In general, a plurality of circuits 10 may be utilized to test the high speed data bus 12 with at least one of the circuits 10 being configured to operate in the first mode while the other circuits 10 operate in the second or third mode. If necessary one or more of the circuits 10 may operate in the fourth mode, allowing the test controller 38 to communicate directly with the high speed data bus 12 or with any other electrical circuit connected to the data bus port 16.

Although the invention has been described with reference to the embodiments illustrated in the attached drawing figures, it is noted that equivalents may be employed and substitutions made herein without departing from the scope of the invention as recited in the claims. For example, the current circuit 10 and system 200 may be utilized to test other high speed data buses, such as the CAN bus used in the automotive industry.

Having thus described various embodiments of the invention, what is claimed as new and desired to be protected by Letters Patent includes the following:

1. A circuit for testing a high speed data bus, the circuit comprising:
   a test port coupled to a test controller;
   a data bus port coupled to the data bus;
   a signal generator configured to generate a test signal to the data bus port at a first voltage level with a duty cycle of fifty percent or greater;
   an attenuation monitor configured to receive the test signal from either the signal generator or the data bus port and determine a second voltage level of the received test signal, the second voltage level communicated to the test port; and
   a polarity monitor configured to
     receive the test signal from the data bus port,
     convert the test signal to a direct current polarity voltage which is proportional to the duty cycle and indicative of a polarity of a portion of the data bus, and
     communicate the polarity voltage to the test port.

2. The circuit of claim 1, wherein the circuit operates in a plurality of modes including:
   a first mode in which the signal generator communicates the test signal to the data bus port and to the attenuation monitor,
   a second mode in which the attenuation monitor receives the test signal from the data bus port,
   a third mode in which the polarity monitor receives the test signal from the data bus port and communicates the polarity voltage to the test port, and
   a fourth mode in which the test port is coupled to the data bus port.

3. The circuit of claim 1, further including a first switching network configured to connect the test port to the polarity monitor, the attenuation monitor, or the data bus port.

4. The circuit of claim 1, further including a second switching network configured to connect the data bus port to the signal generator, the polarity monitor, the attenuation monitor, or the test port.

5. The circuit of claim 1, wherein the test signal is a one megahertz square wave with a duty cycle greater than seventy percent.

6. The circuit of claim 1, wherein the first voltage level is seven volts peak.

7. A circuit for testing a high speed data bus, the circuit comprising:
   a test port coupled to a test controller;
   a data bus port coupled to the data bus;
   a signal generator configured to generate a test signal at a first voltage level with a duty cycle of fifty percent or greater;
   a polarity monitor configured to receive the test signal and convert the test signal to a direct current polarity voltage which is proportional to the duty cycle and indicative of a polarity of a portion of the data bus; and
   an attenuation monitor configured to receive the test signal and determine a second voltage level of the received test signal,
   wherein the circuit operates in a plurality of modes including:
     a first mode in which the signal generator communicates the test signal to the data bus port and to the attenuation monitor which communicates the second voltage level to the test port,
     a second mode in which the attenuation monitor receives the test signal from the data bus port and communicates the second voltage level to the test port,
     a third mode in which the polarity monitor receives the test signal from the data bus port and communicates the polarity voltage to the test port, and
     a fourth mode in which the test port is coupled to the data bus port.

8. The circuit of claim 7, further including a first switching network configured to connect the test port to the polarity monitor, the attenuation monitor, or the data bus port.

9. The circuit of claim 7, further including a second switching network configured to connect the data bus port to the signal generator, the polarity monitor, the attenuation monitor, or the test port.

10. The circuit of claim 7, wherein the test signal is a one megahertz square wave with a duty cycle greater than seventy percent.

11. The circuit of claim 7, wherein the first voltage level is seven volts peak.

12. A system for testing a high speed data bus, the system comprising:
    a first tester circuit coupled to the data bus at a first location and including a signal generator configured to generate a test signal to the data bus at a first voltage level with a duty cycle greater of fifty percent or greater and communicate the first voltage level to a test controller; and
    a second tester circuit coupled to the data bus at a second location and including:
      an attenuation monitor configured to receive the test signal, determine a second voltage level of the received test signal, and communicate the second voltage level to the test controller, and
      a polarity monitor configured to
        receive the test signal from the data bus port,
        convert the test signal to a direct current polarity voltage which is proportional to the duty cycle and indicative of a polarity of a portion of the data bus, and
        communicate the polarity voltage to the test port.

13. The system of claim 12, wherein the second tester circuit includes a switching network configured to connect either the attenuation monitor or the polarity monitor to the test controller.

14. The system of claim 12, wherein the test signal is a one megahertz square wave with a duty cycle greater than seventy percent.

15. The system of claim 12, wherein the first voltage level is seven volts peak.

16. A circuit for testing a high speed data bus, the circuit comprising:
    a test port coupled to a test controller;
    a data bus port coupled to the data bus;
    a signal generator configured to generate a test signal to the data bus port at a first voltage level with a duty cycle of fifty percent or greater;
    an attenuation monitor configured to receive the test signal from either the signal generator or the data bus port and determine a second voltage level of the received test signal, the second voltage level communicated to the test port; and a polarity monitor configured to
- receive the test signal from the data bus port,
- convert the test signal to a direct current polarity voltage which is proportional to the duty cycle and indicative of a polarity of a portion of the data bus, and
- communicate the polarity voltage to the test port, wherein the circuit operates in a plurality of modes including:
- a first mode in which the signal generator communicates the test signal to the data bus port and to the attenuation monitor,
- a second mode in which the attenuation monitor receives the test signal from the data bus port,
- a third mode in which the polarity monitor receives the test signal from the data bus port and communicates the polarity voltage to the test port, and
- a fourth mode in which the test port is coupled to the data bus port.

* * * * *